(12) United States Patent
Hawkins, Sr.

(10) Patent No.: US 6,281,686 B1
(45) Date of Patent: Aug. 28, 2001

(54) NONINTRUSIVE POWER AND CONTINUITY TESTING TOOLS

(76) Inventor: Arnold Hawkins, Sr., 9 Fifth Ave., San Francisco, CA (US) 94118-1307

( * ) Notice: Subject to any disclaimer, the term of this patent is extended or adjusted under 35 U.S.C. 154(b) by 0 days.

(21) Appl. No.: 08/999,009

(22) Filed: Dec. 27, 1997

(51) Int. Cl.⁷ .......................... G01R 31/00; H01H 31/02
(52) U.S. Cl. ...................... 324/555; 324/556; 324/96
(58) Field of Search .................... 324/96, 133, 556, 324/542, 555; 343/894

(56) References Cited

U.S. PATENT DOCUMENTS

| | | | |
|---|---|---|---|
| 4,502,937 | * | 3/1985 | Yagi ........................................ 324/96 |
| 5,208,543 | * | 5/1993 | Albiniak ................................ 324/556 |

FOREIGN PATENT DOCUMENTS

| | | | |
|---|---|---|---|
| 0124872 | * | 6/1986 | (JP) ...................................... 324/133 |
| 0289774 | * | 12/1987 | (JP) ...................................... 324/133 |
| 0313076 | * | 12/1988 | (JP) ...................................... 324/133 |
| 4364476 | * | 12/1992 | (JP) ...................................... 324/133 |
| 1377758 | * | 2/1988 | (SU) ..................................... 324/133 |
| 1714528 | * | 2/1992 | (SU) ..................................... 324/133 |

* cited by examiner

*Primary Examiner*—Safet Metjahic
*Assistant Examiner*—Anjan Deb
(74) *Attorney, Agent, or Firm*—Kenneth W. Float

(57) ABSTRACT

Low-cost, miniature, noninvasive power and continuity testing tools for diagnosing and troubleshooting electrical and electronic systems. The tools may be used to diagnose the condition of electrical equipment such as power cords, ignition wires, and ignition systems. Certain tools do not require a power source to operate, while others are battery powered. One tool comprises a liquid crystal display and an antenna connected a LCD element of the display. RF energy radiated by a tested circuit is sensed by the antenna and is coupled to the LCD element which causes the element to emit light. Another tool comprises a battery, a light emitting diode, and a semiconductor integrated circuit switch. The light emitting diode and integrated circuit switch are coupled in series with the battery. The integrated circuit switch is closed when it is in the presence of RF energy, which completes the circuit and turns on the light emitting diode. In addition, a light amplifying light pipe may be used to cover the light emitting diode which amplifies its light output. Another tool comprises a continuity testing tool comprising a battery and a light emitting diode connected in series between first and second electrical contacts. A light amplifying light pipe surrounds the light emitting diode for amplifying the light output thereof.

8 Claims, 2 Drawing Sheets

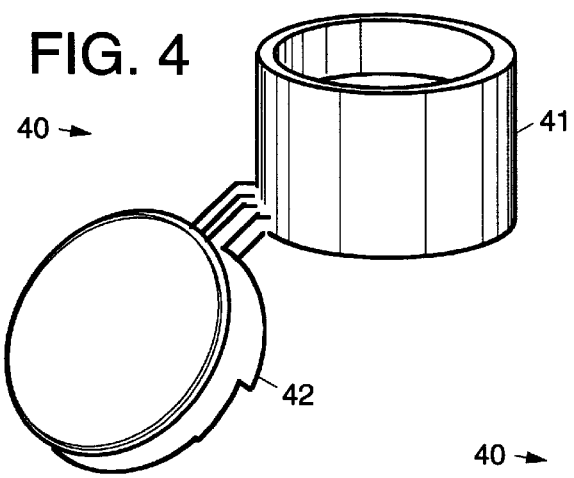
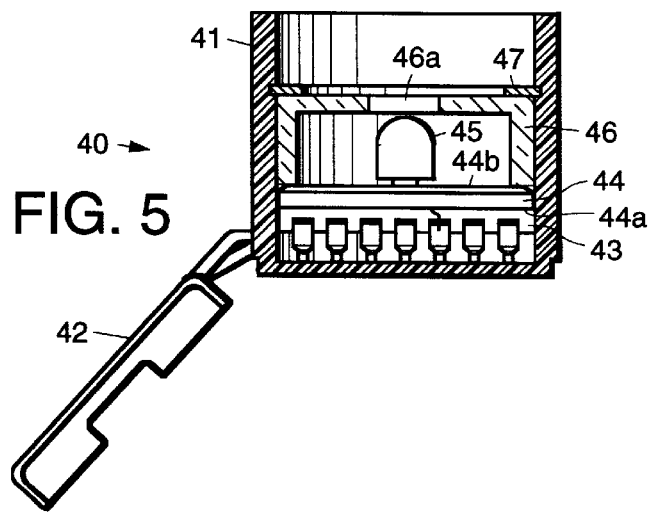
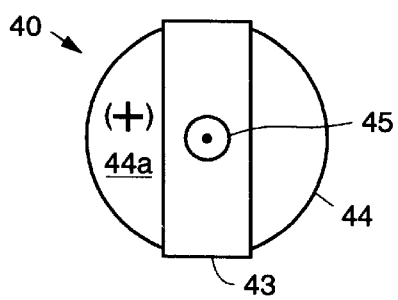
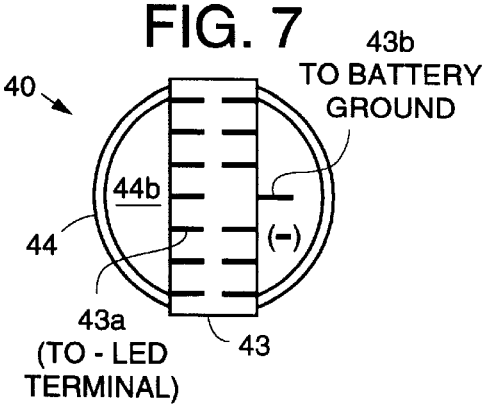
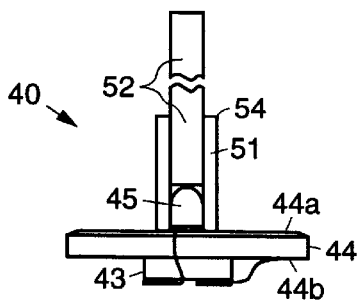
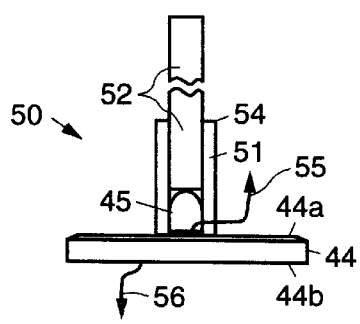

NONINTRUSIVE POWER AND CONTINUITY TESTING TOOLS

BACKGROUND

The present invention relates generally to testing tools, and more particularly, to nonintrusive power and continuity testing tools for troubleshooting electrical and electronic circuits and systems.

There are a number of electrical test probes and equipment available on the market for testing the continuity of an electrical circuit or whether power is flowing through an electrical circuit. For example, a "VoltProbe 440" tool manufactured by Amprobe of Lynbrook N.Y., is a battery-operated testing probe that is used to determine if power is flowing through an electrical circuit. This tool has two electrical leads that are used to contact a test point and ground. If power flows through the tool, an audible sound is made indicating that a tested portion of the electrical circuit is functional. Radio Shack also sells a battery powered voltage sensor tool, part number 22–103, that operates in a similar manner. The Radio Shack circuit buzzes or flashes a light when is in close proximity to a powered circuit.

One particular embodiment of the present invention was developed as a test tool for use with ignition assemblies of burners, such as are used in boilers, furnaces, and internal combustion engines, for example. Typically, burners for boilers, such as those manufactured by Honeywell, for example, use optional monitoring systems that monitor various portions of the ignition system to determine if it is operating properly. Such monitoring systems are very expensive, and do not always accurately determine the functionality of the ignition assembly. However, these and other similar tools require a battery or other power source to operate. Also, the tools must be electrically connected to the circuit in order for the tool to properly operate.

It would therefore be an advantage to have a testing tool that does not require a power source to operate. The conventional electrical test probes mentioned above are connected to the circuit that is to be tested. It would also be an advantage to have a testing tool that is noninvasive, in that physical contact with the tested electrical circuit is not required in all circumstances.

Furthermore, conventional continuity testing tools, such as volt-ohm meters, and the like, are somewhat cumbersome. It would be an advantage to have a continuity testing tool that is easy to handle and whose output is easily seen.

Accordingly, it is an objective of the present invention to provide for power and continuity testing tools for troubleshooting electrical and electronic systems. It is another objective of the present invention to provide for a power testing tool that is noninvasive and does not require power source to operate. It is another objective of the present invention to provide for power and continuity testing tools that are easy to handle and whose output is easily seen.

SUMMARY OF THE INVENTION

To meet the above and other objectives, the present invention provides for noninvasive power and continuity testing tools for troubleshooting electrical and electronic systems. Certain embodiments of the present invention do not require a power source to operate, while others are battery powered.

A first embodiment of the power testing tool comprises a liquid crystal display (LCD) having an antenna electrically connected to at least one or more electrodes that are coupled to one or more liquid crystal display elements. The antenna is exposed at its end distal from its connection to the liquid crystal display element. RF energy radiated by a circuit that is tested is sensed by the antenna and is coupled to the liquid crystal display element. It is believed that the doping of the semiconductor material used to produce the liquid crystal display makes the liquid crystal display element(s) sensitive to the sensed RF energy, which causes the light emitting diode element(s) connected to the antenna to emit light when the RF energy is sensed.

A second embodiment of the present invention comprises a battery powered power testing tool. The battery powered power testing tool is a miniature compact nonintrusive tool for detecting the condition of electrostatic and electromagnetic fields. The tool can detect if a signal voltage is present in an electrical circuit and trace whether or not current is flowing through portions of a circuit. The tool senses signals without direct metal-to-metal electrical connections, or breaking into or piercing electrical insulation or power lines. The tool detects electromagnetic fields such as automobile ignition startup cycles and provides a visual indication of the timing cycle.

The battery powered power testing tool comprises a battery, an integrated circuit that may be operated as a switch, and a light emitting diode (LED). The positive lead of the light emitting diode is coupled to the positive terminal of the battery. The negative lead of the light emitting diode is coupled to a first pin of the integrated circuit (i.e., one end of the switch). A second pin of the integrated circuit is coupled to the ground terminal of the battery. RF energy radiated by the circuit that is tested is sensed by the integrated circuit (the switch) which is switched on to form a complete circuit between the battery and the light emitting diode. It is believed that the doping of semiconductor material used to produce the integrated circuit makes the semiconductor material sensitive to the sensed RF energy. In any event, the switch in the integrated circuit is closed when RF energy is sensed, which completes the circuit when the RF energy is sensed, which in turn couples power from the battery through the integrated circuit (switch) to the light emitting diode. The light emitting diode emits light to provide an indication of the operation of the tested circuit. Holding the device while testing the circuit enhances the sensitivity of the tool and increases the brightness of the light emitting diode. Holding the tool provides an electrical path to ground through the body that completes the circuit. In addition, a plastic sleeve and plug may be used to cover the light emitting diode which amplifies the light output of the light emitting diode.

The present invention also contemplates a continuity testing tool, which is a derivative of the battery powered power testing tool. The continuity testing tool comprises a battery, a light emitting diode having its positive terminal connected to the positive terminal of the battery and its negative terminal connected to a contact. A second contact is connected to the negative terminal of the battery. An amplifying light pipe used to cover the light emitting diode, and which amplifies the light output thereof.

BRIEF DESCRIPTION OF THE DRAWINGS

The various features and advantages of the present invention may be more readily understood with reference to the following detailed description taken in conjunction with the accompanying drawings, wherein like reference numerals represent like structural elements, and in which

FIG. 4 is a perspective view of a second embodiment of the power testing tool in accordance with the principles of the present invention;

FIG. 5 is a cutaway side view of the power testing tool of FIG. 4;

FIG. 6 is a top view of the operative components of the power testing tool of FIG. 4;

FIG. 7 is a bottom view of the operative components of the power testing tool of FIG. 4;

FIG. 8 is a side view of the operative components of the power testing tool of FIG. 4, which also illustrates additional components that enhance the light output of the tool; and FIG. 9 illustrates an embodiment of a continuity testing tool in accordance with the principles of the present invention.

DETAILED DESCRIPTION

Figure 1:
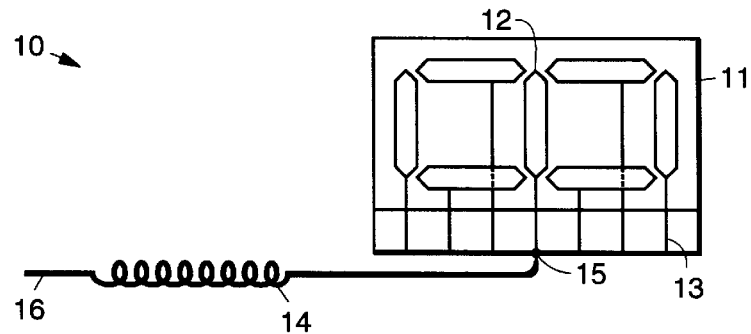
FIG. 1 illustrates a first embodiment of a power testing tool in accordance with the principles of the present invention.

Referring to the drawing figures, FIG. 1 illustrates a first embodiment of a noninvasive power testing tool 10 in accordance with the principles of the present invention. The first embodiment of the noninvasive power testing tool 10 may be used to troubleshoot electrical and electronic systems, for example.

The first embodiment of the power testing tool 10 comprises a liquid crystal display (LCD) 11 having an antenna 14 electrically connected to at least one or more electrodes 15 that are coupled to one or more liquid crystal display elements 12. The antenna 14 is exposed at an end 16 distal from its connection to the liquid crystal display 11. An AM radio loop stick antenna 14, for example, may be used as the antenna 14. RF energy radiated by a circuit that is tested is sensed by the antenna 14 and is coupled to the liquid crystal display element 12. It is believed that doping of the semiconductor material used to produce the liquid crystal display 12 makes the liquid crystal display 12 or elements 12 sensitive to the sensed RF energy, which causes the light emitting diode element 12 or elements 12 connected to the antenna 14 to emit light when the RF energy is sensed.

Operation of the first embodiment of the power testing tool 10 is extremely simple. The exposed end 16 of the antenna 14 may be held in close proximity to a spark from an ignition coil of an engine, or close to the flame of a burner, for example. Furthermore, the exposed end 16 of the antenna 14 may be held in contact with an electrical contact or lead of an electrical circuit that is to be tested. The exposed end 16 of the antenna 14 may be inserted into separate electrical contacts of a wall socket, for example, to test continuity or test for polarity. In any of the above testing scenarios, the liquid crystal display element 12 or elements 12 that contact the antenna 14 will be energized if there is power at the test point that is probed by the antenna 14. If the circuit is open, then the liquid crystal display element 12 or elements 12 will not be energized.

The polarity of the terminals of the wall socket are easily tested using the first embodiment of the power testing tool 10. The wall socket has a neutral contact that is the large flat plug opening, the hot contact is the smaller flat plug opening, while the ground is the round plug opening. In a properly configured plug, the ground and neutral contacts will not energize the liquid crystal display element(s) of the power testing tool 10, while the hot contact will. If the polarity of the wall socket is reversed, then the neutral contact will energize the liquid crystal display element 12 or elements 12 and the hot terminal will not, clearly indicating an improperly wired wall socket. Proper polarity is very important when computers, for example, are plugged into the wall socket.

Figure 2:
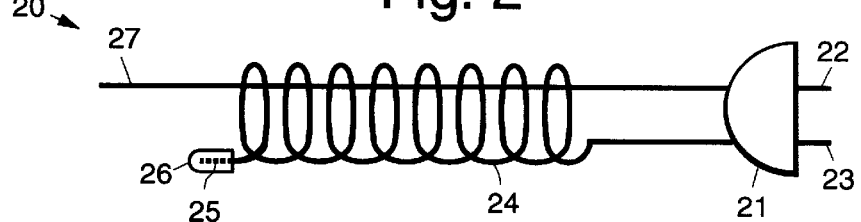
FIG. 2 shows a probe that may be used in conjunction with the tool of FIG. 1 to check the polarity a wall outlet.

Referring to FIG. 2, a wall socket probe 20 may be used in conjunction with the tool 10 of FIG. 1 to check the polarity of a wall outlet. The wall socket probe 20 comprises an AC plug 21 whose neutral contact 22 is connected to a straight wire 27 and whose hot contact 23 is coupled to a wire 24 that is wrapped around the straight wire 27 and whose end 25 is terminated in a plastic or other insulating cap 26. The RF field radiated by the wall socket probe 20 is easily detected by the power testing tool 10 when it is plugged into a wall socket.

Figure 3:
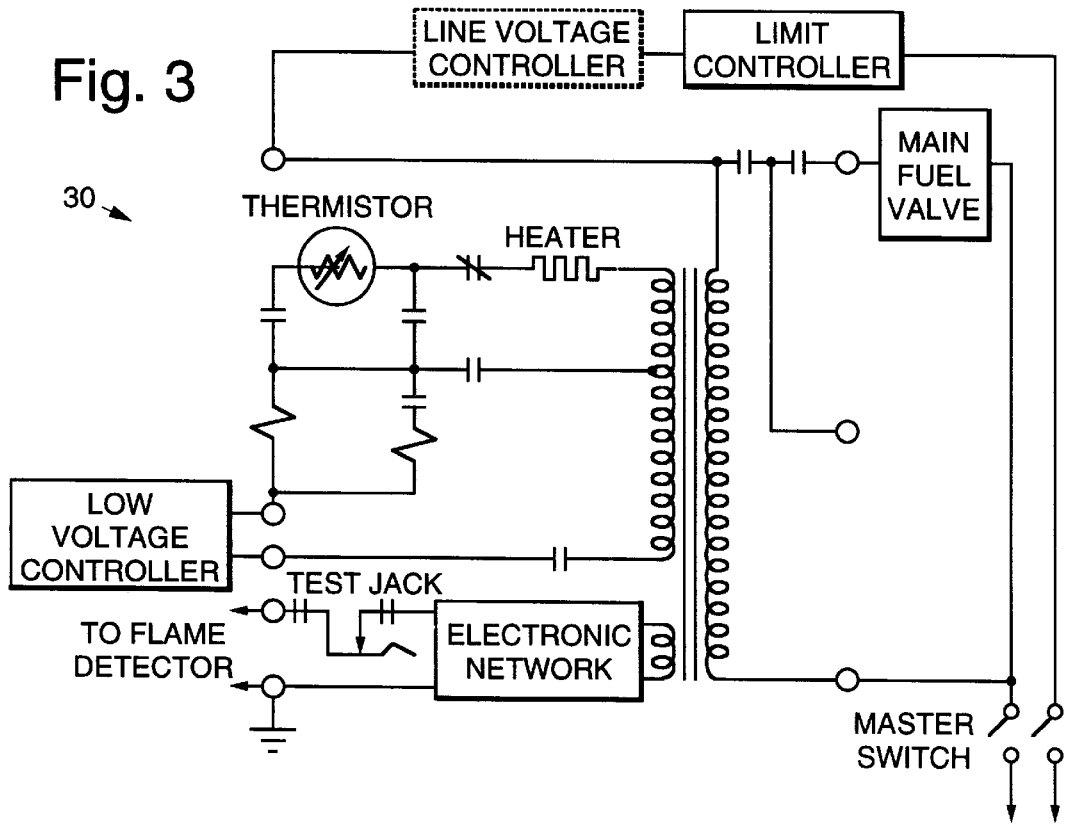
FIG. 3 illustrates a burner control circuit that may be tested using the present invention.

FIG. 3 illustrates an exemplary burner control circuit 30 that may be tested using the power testing tool 10. The exemplary burner control circuit 30 is manufactured by Honeywell, model number RA890H. Construction of this circuit 30 will not be detailed, but should be readily understood by those skilled in the art. The power testing tool 10 may be used to test such a circuit 30 by touching the antenna 14 to any of its terminals (the small circles shown in FIG. 3) to determine if power is present at the touched terminal.

A second embodiment of the present invention comprises a battery powered power testing tool 40. FIG. 4 is a perspective view of the second embodiment of the power testing tool 40. FIG. 5 is a cutaway side view of the power testing tool 40 of FIG. 4. FIG. 6 is a top view of the operative components of the power testing tool 40 of FIG. 4. FIG. 7 is a bottom view of the operative components of the power testing tool 40 of FIG. 4. FIG. 8 is a side view of the operative components of the power testing tool 40 of FIG. 4, which also illustrates additional components that enhance the light output of the tool 40.

The battery powered power testing tool 40 comprises a battery 44, a semiconductor integrated circuit 43 that is operated as a switch, and a light emitting diode (LED) 45. In general, the light emitting diode 45 and integrated circuit switch 43 are coupled in series with the battery 44. The integrated circuit switch 43 is closed when it is in the presence of RF energy, which completes the circuit and turns on the light emitting diode 45.

More specifically, the integrated circuit 43 may comprise a hex inverter containing a transistor such as a field effect transistor, for example. Another exemplary integrated circuit 43 that may be used is a Goldstar circuit, model GD4069UB, or comparable circuit manufactured by National Semiconductor or Motorola. A positive lead of the light emitting diode 45 is coupled to a positive terminal 44a of the battery 44. The negative lead of the light emitting diode 45 is coupled to a first pin 43a of the integrated circuit (i.e., to an input of the switch). A second pin 43b of the integrated circuit (the output of the switch) is coupled to the ground terminal 44b of the battery 44. RF energy radiated by the circuit that is tested is sensed by the integrated circuit 43 (the switch) which is switched on to form a complete circuit between the battery 44 and the light emitting diode 45. It is believed that the doping of semiconductor material used to produce the integrated circuit 43 makes the semiconductor material sensitive to the sensed RF energy. In any event, the switch in the integrated circuit 43 is closed when RF energy is sensed, which completes the circuit when the RF energy is sensed, which couples power from the battery 44 through the integrated circuit 43 (switch) to the light emitting diode 45.

A housing 41 is provided that comprises a removable cap 42, a retaining member 47, and a separator 46. The light emitting diode 45, the battery 44, and the integrated circuit 43 are retained within the housing 41. The separator 46 has an opening 46a therein that permits light emitted from the light emitting diode 45 to be seen.

The light emitting diode 45 emits light to provide an indication of the operation of the tested circuit. Holding the tool 40 while testing the circuit enhances the sensitivity of the tool 40 and increases the brightness of the light emitting diode 45. Holding the tool 40 provides an electrical path to ground through the body that completes the circuit. In addition, as is shown in FIG. 8, a light amplifying light pipe 54 comprising a plastic sleeve 51 and plug 52 or rod 52 inserted within the sleeve 51 may be used to cover the light emitting diode 45. The plastic sleeve 51 and plug 52 or rod 52 is used as an amplifying light pipe 54 which amplifies the light output of the light emitting diode 45.

The battery powered power testing tool 40 does not require a printed circuit board, and is a highly reliable circuit that may be produced at a very low cost. The battery powered power testing tool 40 may be used in testing or troubleshooting combustion engines and pneumatic, electrical and electronic combustion control systems. For example, the battery powered power testing tool 40 may be used to determine whether the air-fuel mixture supplied to a burner is properly set, and to determine the proper operation of spark plugs, and the like.

The battery powered power testing tool 40 provides for a miniature compact nonintrusive tool for detecting the condition of electrostatic and electromagnetic fields. The tool 40 can detect if a signal voltage is present in an electrical circuit and trace whether or not current is flowing through portions of a circuit. The tool 40 senses signals without direct metal-to-metal electrical connections, or breaking into or piercing electrical insulation or power lines. The tool 40 detects electromagnetic fields such as automobile ignition startup cycles and provides a visual indication of the timing cycle.

When testing or troubleshooting using the battery powered power testing tool 40, preferably a first tool 40 is fastened at an input side of an ignition transformer or any other source of an electromagnetic field, while a second tool 40 is fastened at the output side of the ignition transformer, or other source. Power delivered to the primary of the ignition transformer provides an on signal for the light emitting diode 45. An arc or too wide of a spark gap at the ignition source closes the switch and provides an "on" signal to the light emitting diode 45. If the ignition source is grounded, the light emitting diode 45 is "off".

If a slowly varying alternating current is passed though a conductor or other RF energy generating source, the light emitting diode 45 varies in brightness, or blinks, which follows the change in current strength. If the current variation takes place more rapidly than about 50 to 60 per second, the light emitting diode 45 glows brilliantly.

If the battery powered power testing tool 40 is used to test an electrodynamic environment, such as an ignition system of a combustion engine, for example, preferably a first tool 40 is fastened to the porcelain enamel portion of a spark plug of the engine, a second tool 40 is fastened to an ignition cable leaving the secondary side of the spark coil, and third and fourth tools 40 are fastened to each side of the power supply. After the fuel-air ratio has been set and correctly adjusted, the engine is started. Signals received from each tools 40 are then observed or recorded. The tools 40 are used to follow the ignition path and determine how efficiently the fuel is burned or used. The system is intentionally upset and the signals at the tools 40 are again observed or recorded. This testing technique may be used to test, study or troubleshoot any ignition system or any other relay switching or amplifying circuit. In general, if there is no resistance between the arc to ground then the light emitting diode 45 is bright. When fuel is passed through the arc, then the light emitting diode 45 dims, or blinks, because of the lessened RF field that is sensed.

If the battery powered power testing tool 40 is used to test an electrostatic environment, such as series and parallel electrical circuits. Two tools 40 are used to test such circuits, one located on the input power side of the circuit to be tested and one on the output side of the circuit. Such circuits may include fuses, limit switches, relays, and other interlock devices used in HVAC industries. For parallel circuits, the tool 40 may fastened to the insulation of the hot wire of the circuit, which will turn on the light emitting diode 45. Alternatively, the tool 40 may be held in one hand and the bottom of the tool 40 held against the wire of the circuit being tested. The tool 40 will indicated hot or neutral polarity. If the polarity is hot, then the light emitting diode 45 will be on. If the polarity is neutral, then the light emitting diode 45 will be off.

The present invention also contemplates a continuity testing tool 50, which is a derivative of the battery powered power testing tool 40. FIG. 9 illustrates an embodiment of the continuity testing tool 50. The continuity testing tool 50 comprises a battery 44, a light emitting diode 45 having its positive lead connected to the positive terminal 44a of the battery and its negative lead connected to an alligator clip 55 or contact 55. A second alligator clip 56 or contact 56 is connected to the negative terminal 44b of the battery 44. In essence the continuity testing tool has the battery 44 and light emitting diode 45 connected in series between the first and second electrical contacts 55, 56. A light amplifying light pipe 54 comprising a plastic sleeve 51 and plug 52 or rod 52 is used to cover the light emitting diode 45, and which amplifies the light output of the light emitting diode 45.

The continuity testing tool 50 is used by contacting the alligator clips 55, 56 or contacts 55, 56 across an unpowered circuit or component. If continuity is present in the tested component or portion of the unpowered circuit, then the light emitting diode 45 will turn on, which is easily seen using the amplifying light pipe 54. The continuity testing tool 50 is very inexpensive to manufacture and is highly reliable, and readily visible because of the use of the amplifying light pipe 54.

Thus, improved nonintrusive power and continuity testing tools have been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A nonintrusive battery powered tool comprising:
   a battery having positive and negative terminals;
   a light emitting diode having positive and negative leads, and wherein the positive lead is coupled to the positive terminal of the battery; and
   a semiconductor integrated circuit switch, and wherein a negative lead of the light emitting diode is coupled to an input of the integrated circuit switch and wherein the output of the integrated circuit switch is coupled to the ground terminal of the battery; and wherein the presence of electromagnetic energy near the tool closes the integrated circuit switch to complete the circuit and turn on the light emitting diode.

2. The tool of claim 1 wherein the semiconductor integrated circuit switch comprises a hex inverter containing a transistor.

3. The tool of claim 1 wherein the semiconductor integrated circuit switch comprises a field effect transistor.

4. The tool of claim 1 further comprising a light amplifying light pipe for amplifying the light output of the light emitting diode.

5. The tool of claim 4 wherein the light amplifying light pipe comprises:

a plastic sleeve having a rod inserted within the sleeve for covering the light emitting diode and for amplifying the light output of the light emitting diode.

6. A nonintrusive battery powered tool comprising:

a battery having positive and negative terminals;

a light emitting diode having positive and negative leads, and wherein the positive lead is coupled to the positive terminal of the battery;

a semiconductor integrated circuit switch, and wherein a negative lead of the light emitting diode is coupled to an input of the integrated circuit switch and wherein the output of The integrated circuit switch is coupled to the ground terminal of the battery; and a plastic sleeve having a rod inserted within the sleeve for covering the light emitting diode and for amplifying the light output of the light emitting diode.

7. The tool of claim 6 wherein the semiconductor integrated circuit switch comprises a hex inverter containing a transistor.

8. The tool of claim 6 wherein the semiconductor integrated circuit switch comprises a field effect transistor.

* * * * *